(12) United States Patent
Kitamura et al.

(10) Patent No.: US 6,791,180 B2
(45) Date of Patent: Sep. 14, 2004

(54) CERAMIC CIRCUIT BOARD AND POWER MODULE

(75) Inventors: Yukihiro Kitamura, Nagano (JP); Takayuki Takahashi, Nagano (JP); Mitsuru Ohta, Nagano (JP); Yuji Ogawa, Nagano (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/386,325

(22) Filed: Mar. 11, 2003

(65) Prior Publication Data

US 2003/0173660 A1 Sep. 18, 2003

(30) Foreign Application Priority Data

Mar. 15, 2002 (JP) .................................... P2002-071785

(51) Int. Cl.$^7$ ............................................ H01L 23/12
(52) U.S. Cl. ..................... 257/701; 257/705; 438/125
(58) Field of Search ............................... 257/701, 704, 257/705, 659, 703; 438/125

(56) References Cited

U.S. PATENT DOCUMENTS

| | | | | |
|---|---|---|---|---|
| 4,480,262 A | * | 10/1984 | Butt ........................... | 257/675 |
| 5,268,533 A | * | 12/1993 | Kovacs et al. .............. | 174/52.4 |
| 5,532,514 A | * | 7/1996 | Kozono ....................... | 257/728 |
| 5,825,092 A | * | 10/1998 | Delgado et al. ............ | 257/778 |
| 6,111,761 A | * | 8/2000 | Peana et al. ................ | 361/818 |

OTHER PUBLICATIONS

Japanese Patent Laid–Open No. 7–276035 (published on Oct. 24, 1995).
Japanese Patent Laid–Open No. 11–263676 (published on Sep. 28, 1999).
Japanese Patent Laid–Open No. 2001–77245 (published on Mar. 23, 2001).
Japanese Patent Laid–Open No. 7–77989 (published on Aug. 23, 1995).
Japanese Patent Laid–Open No. 3–261669 (published on Nov. 21, 1991).
Japanese Patent Laid–Open No. 11–330308 (published on Nov. 30, 1999).
Japanese Patent Laid–Open No. 7–202073 (published on Aug. 4, 1995).
Japanese Patent Laid–Open No. 5–41566 (published on Feb. 19, 1993).

* cited by examiner

Primary Examiner—S. V. Clark
(74) Attorney, Agent, or Firm—Bachman & LaPointe, P.C.

(57) ABSTRACT

In a ceramic circuit board having a ceramic substrate and a metal circuit plate bonded to one surface of the ceramic substrate, assuming that the warpage of the ceramic circuit board is a difference in height between the center and edge of the metal circuit plate and is positive (+) when the circuit board warps so as to be concave on the side of the metal circuit plate, the warpage of the ceramic circuit board is in the range of from –0.1 mm to +0.3 mm when the ceramic circuit board is heated to 350° C., and in the range of from +0.05 mm to +0.6 mm when the temperature of the ceramic circuit board is returned to a room temperature after the ceramic circuit board is heated to 350° C. The initial warpage of the ceramic circuit board is in the range of from +0.05 mm to +0.6 mm.

16 Claims, 6 Drawing Sheets

CERAMIC CIRCUIT BOARD AND POWER MODULE

BACKGROUND OF THE INVENTION

1. Field of the Invention

The present invention generally relates to a ceramic circuit board and a method for producing the same. More specifically, the invention relates to a reliable ceramic circuit board having an excellent thermal shock resistance, a method for producing the same, and a reliable power module using the ceramic circuit board.

2. Description of the Prior Art

As one of substrates used for mounting thereon electronic parts, there is utilized a ceramic circuit board wherein a metal plate is bonded to at least one surface of a ceramic substrate. Ceramic substrates are particularly utilized as substrates for large power elements, such as substrates for power modules, since the withstand voltage and thermal conductivity of ceramic substrates are superior to those of glass epoxy substrates and metal substrates. In recent years, power modules are mounted on ceramic substrates for controlling motors for automobiles and electric trains, so that the higher reliability of ceramic circuit boards is requested.

As improved reliable ceramic circuit boards complying with such a request, ceramic circuit boards using an aluminum plate as a circuit metal plate and/or a heat sink metal plate (Japanese Patent Laid-Open Nos. 7-276035 and 11-263676), a ceramic circuit board using a ceramic having an improved strength (Japanese Patent Laid-Open No. 2001-77245), and ceramic circuit boards using a metal plate having a sectional shape of a stress relaxation structure (Japanese Patent Publication No. 7-77989 and Japanese Patent Laid-Open No. 3-261669) have been proposed to be put to practical use. These ceramic circuit boards are designed to avoid defectives due to dielectric breakdown and so forth, by suppressing the occurrence of cracks in a ceramic substrate when thermal shocks (heat cycles) are applied thereto. There have been also disclosed a ceramic circuit board having a ceramic substrate having a controlled initial warpage (Japanese Patent Laid-Open No. 11-330308), a ceramic circuit board having a defined flexure quantity when a load is applied to a ceramic substrate (Japanese Patent Laid-Open No. 7-202073), and a ceramic circuit board having a metal plate having holes in the vicinity of the periphery thereof (Japanese Patent Laid-Open No. 5-41566). These ceramic circuit boards have an improved reliability, such as an improved heat cycle resistance.

The ceramic circuit board, which uses the aluminum plate and which is disclosed in Japanese Patent Laid-Open Nos. 7–276035 and 11-263676, of the above described conventional ceramic circuit boards, can decrease stress applied to the ceramic substrate by the plastic deformation of the aluminum plate, so that its reliability, such as heat resistance, is superior to that of a ceramic circuit board using a copper plate or the like. However, if the aluminum plate is thicker or if the aluminum plate is bonded to the ceramic substrate by the brazing and soldering, there are some cases where stress is too strong to obtain sufficient reliability.

If the ceramic having a high strength, i.e., a high bending strength and/or toughness, which is described in Japanese Patent Laid-Open No. 2001-77245 is used, material costs are often higher than those in general articles due to the expensiveness of the material and difficulty of production, and other characteristics, such as thermal conductivity, are often deteriorated. Therefore, it is desired to provide a ceramic circuit board having a satisfied reliability even if a general alumina or aluminum nitride substrate, which is mass-produced by the sheet forming method or the like and which has an average bending strength of about 20 to 50 kg/mm$^2$ at present, is used. Even in the case of a ceramic substrate having a high strength, such as a silicon nitride substrate, there are some cases where the thickness of the substrate is decreased by the request to improve thermal conductivity or the like. In such cases, there are some cases where a sufficient reliability can not be obtained.

The ceramic circuit boards which are disclosed in Japanese Patent Publication No. 7-77989 and Japanese Patent Laid-Open No. 3-261699 and which use a metal plate having a sectional shape of a stress relaxation structure, can obtain some advantageous effects with respect to stress relaxation, but production costs for forming such a structure (shape) are higher than those for usual products which do not have such a structure.

The ceramic circuit boards which are disclosed in Japanese Patent Laid-Open Nos. 11-330308 and 7-202073 and which has a controlled initial warpage or flexure quantity, can obtain some advantageous effects. However, it has been found that the initial warpage or flexure quantity does not always correspond to a thermal shock resistance during assembly and that there are some cases where cracks are produced during heating or cooling when a chip is soldered to the substrate.

The ceramic circuit board which is disclosed in Japanese Patent Laid-Open No. 5-41566 and which has a metal plate having holes in the vicinity of the periphery thereof, can obtain some advantageous effects without increasing production costs. However, in recent years, it is desired to further increase the thermal shock resistance by shortening the time required to carry out an assembly step. In addition, there are some case where cracks are produced in accordance with the structure of the ceramic circuit board, e.g. the material and thickness of the metal plate and the strength of the ceramic substrate, although it is superior to a ceramic circuit board having a structure having no holes. Therefore, there are some cases where the ceramic circuit board can not be used if only this technique is used.

SUMMARY OF THE INVENTION

It is therefore an object of the present invention to eliminate the aforementioned problems and to provide an inexpensive, reliable ceramic circuit board, a method for producing the same, and a reliable power module using the ceramic circuit board.

In order to accomplish the aforementioned and other objects, the inventors have diligently studied and found that it is possible to provide an inexpensive, reliable ceramic circuit board by controlling the warpage of the ceramic circuit board at 350° C., i.e. the warpage of the ceramic circuit board at a high temperature when chips, terminals and/or a heat sink plate are soldered, and the warpage of the ceramic circuit board when the temperature thereof is returned to a room temperature, in order to improve there liability of the ceramic circuit board against thermal shocks at a subsequent step of assembling a power module. That is, the inventors found that it is possible to improve the thermal shock resistance of a ceramic circuit board, e.g., it is possible to prevent cracks from being produced during assembly, by particularly controlling the warpage of the ceramic circuit board at a high temperature, and that it is possible to improve the heat cycle resistance of the ceramic circuit board as a product by controlling the warpage of the ceramic circuit board when the temperature thereof is returned to a room temperature. Thus, the inventors have made the present invention.

According to one aspect of the present invention, a ceramic circuit board comprises: a ceramic substrate; and a metal circuit plate bonded to one surface of the ceramic substrate, wherein assuming that a warpage of the ceramic circuit board is a difference in height between a center and edge of the metal circuit plate and is positive (+) when the circuit board warps so as to be concave on the side of the metal circuit plate, the ceramic circuit board has a warpage of −0.1 to +0.3 mm when the ceramic circuit board is heated to 350° C., and has a warpage of +0.05 to +0.6 mm when the temperature of the ceramic circuit board is returned to a room temperature after the ceramic circuit board is heated to 350° C.

In this ceramic circuit board, the ceramic circuit board may have an initial warpage of +0.05 to +0.6 mm. The ceramic circuit board preferably further comprises a metal plate bonded to the other surface of the ceramic substrate. In addition, at least one through hole or recessed portion is preferably formed in a surface of at least one of the metal circuit plate and metal plate in the vicinity of the periphery thereof. The metal circuit plate and the metal plate are preferably made of copper or aluminum as a principal component. If the principal component of the metal circuit plate and metal plate is copper, the thickness of the metal circuit plate is preferably in the range of from 0.2 mm to 1.2 mm, and the thickness of the metal plate is preferably in the range of from 0.1 mm to 1.1 mm. If the principal component of the metal circuit plate and metal plate is aluminum, the thickness of the metal circuit plate is preferably in the range of from 0.3 mm to 2.4 mm, and the thickness of the metal plate is preferably in the range of from 0.1 mm to 2.2 mm. The principal component of the ceramic substrate is preferably selected from the group consisting of alumina, aluminum nitride and silicon nitride. The ceramic substrate preferably has a three-point bending strength of 30 kgf/mm$^2$ or more.

According to another aspect of the present invention, there is provided a method for producing a ceramic circuit board, the method comprising the steps of: preparing a ceramic substrate and a metal circuit plate; and bonding the metal circuit plate to a concave side of the ceramic substrate. In this method for producing a ceramic circuit board, the metal circuit plate and metal plate are preferably bonded directly to the ceramic substrate or bonded to the ceramic substrate via a brazing filler metal. In addition, the metal plate is bonded to a convex side of the ceramic substrate.

According to a further aspect of the present invention, there is provided a power module assembled by using any one of the above described ceramic circuit boards.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 3A through 3C are views showing a ceramic circuit board obtained in Example 1, wherein FIG. 3A is a sectional view thereof, FIG. 3B is a plan view thereof, and FIG. 3C is a bottom view thereof;

FIGS. 5A through 5C are views showing a ceramic circuit board obtained in Example 5, wherein FIG. 5A is a sectional view thereof, FIG. 5B is a plan view thereof, and FIG. 5C is a bottom view thereof;

FIGS. 6A through 6C are views showing a ceramic circuit board obtained in Example 6, wherein FIG. 6A is a sectional view thereof, FIG. 6B is a plan view thereof, and FIG. 6C is a bottom view thereof; and FIGS. 7A through 7C are views showing a ceramic circuit board obtained in Example 7, wherein FIG. 7A is a sectional view thereof, FIG. 7B is a plan view thereof, and FIG. 7C is a bottom view thereof.

DESCRIPTION OF THE PREFERRED EMBODIMENTS

Figure 1:
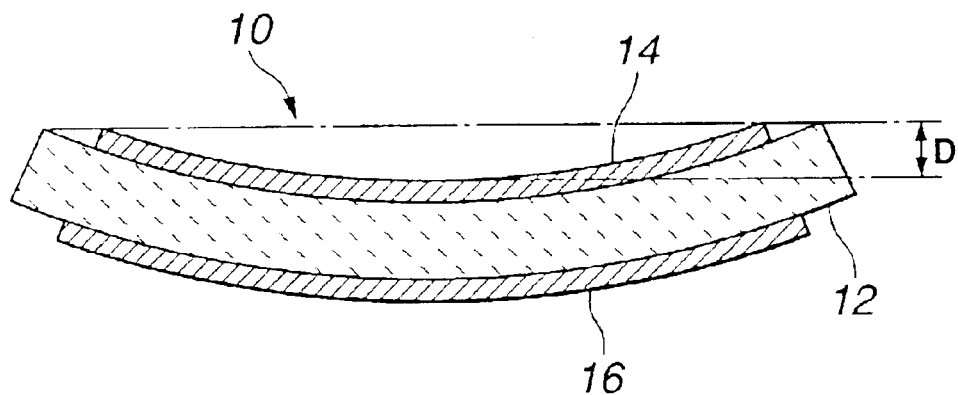
FIG. 1 is a sectional view for explaining a warpage of a ceramic circuit board.

Referring now to the accompanying drawings, the preferred embodiments of a ceramic circuit board according to the present invention will be described below.

In a preferred embodiment of a ceramic circuit board according to the present invention, an alumina substrate, an aluminum nitride substrate or a silicon nitride substrate, which are insulating substrates and which are used for power modules, is preferably used as a ceramic substrate. These substrates are widely produced on a commercial basis as general products by the sheet or press forming method, and have different characteristics, respectively. The alumina substrate is characterized by a lower thermal conductivity than that of other substrates through it is inexpensive, the aluminum nitride substrate is characterized by a high thermal conductivity though it is relatively expensive, and the silicon nitride substrate is characterized by a higher strength and toughness than those of the alumina substrate and aluminum nitride substrate though it is relatively expensive. Therefore, the alumina substrate may be used if costs are regarded as important, the aluminum nitride substrate may be used if thermal conductivity is regarded as important, and the silicon nitride substrate may be used if strength is regarded as important. Also, if a composite ceramic substrate, which has a strength and toughness highly improved by adding 30% of zirconia to alumina serving as a principal component, is applied, it is possible to improve thermal shock resistance, so that such a composite ceramic substrate may be used in accordance with the purpose. The present invention is preferably applied to an alumina or aluminum nitride substrate having a relatively low strength, or a relatively thin ceramic substrate having a thickness of 0.25 to 0.5 mm, in order to more effectively utilize the advantageous effects of the present invention.

The metal circuit plate and metal plate are preferably made of copper or aluminum as a principal component in view of electrical resistance and heat sink characteristics. Copper is characterized by a good thermal conductivity and electric conductivity while it is relatively inexpensive, and aluminum is characterized in that it is difficult to cause damage to ceramics due to its softness and it is light though its thermal conductivity and electric conductivity are inferior to those of copper. These materials may be chosen in accordance with the purpose of products.

Methods for bonding a metal circuit plate and a metal plate to a ceramic substrate include the active metal method utilizing a brazing filler metal, and the direct bonding method for directly arranging a metal circuit plate and/or a metal plate on a ceramic substrate to heat them in an inert gas. These methods are advantageous in view of production costs. For example, in a case where it is intended to bond a copper plate to a ceramic substrate, it is known that, if an oxygen free copper plate, the surface of which is oxidized, or a tough pitch copper plate is arranged on an oxide ceramic substrate, such as an alumina substrate, to be heated in an inert gas, the copper plate can be bonded directly to the ceramic substrate. In either case, the present invention can obtain the same advantageous effects. The present invention should not be limited to the above described methods if the warpage according to the present invention can be realized by other methods, such as a direct bonding method using a molten metal of aluminum. Throughout the specification, the term "warpage" means a difference D in height between the center and edge of a metal circuit plate 14 of a ceramic circuit board 10 wherein the metal circuit plate 14 and a metal plate 16 are bonded on both sides of a ceramic substrate 12, and it is assumed that the warpage is positive (+) when the ceramic substrate 12 warps so as to be concave on the side of the metal circuit plate 14 and that the warpage is negative (−) when the ceramic substrate 12 warps so as to be convex on the side of the metal circuit plate 14.

Methods for forming a predetermined circuit pattern of a metal circuit plate include a method for forming a resist having a circuit shape on the surface of a metal plate which is bonded to a ceramic substrate and for patterning the metal plate by etching, and a method for bonding a metal plate having a circuit shape, which is formed by press working or etching, on a ceramic substrate. After the pattern is formed, the metal plate may be plated with Ni or an Ni alloy if necessary.

According to the present invention, a warpage of a produced ceramic circuit board after heating to 350° C., a warpage of the ceramic circuit board when the temperature is returned to a room temperature, and an initial warpage are defined to improve reliability when the ceramic circuit board is assembled as a power module or the like.

The warpage of the ceramic circuit board after heating must be in the range of −0.1 mm to +0.3 mm. The reasons for this are as follows. If the warpage after heating is less than −0.1 mm, thermal shock resistance and heat cycle resistance after a step of assembling or producing a power module are not sufficient, so that cracks are easily produced in the ceramic substrate. If the warpage is extremely negative (−) at a soldering step, outgassing from solder can not suitably be carried out, so that solder voids are caused. On the other hand, if the warpage after heating is greater than +0.3 mm, the whole circuit board is inclined. Therefore, for example, at an assembly step of soldering chips and/or terminals when a power module is assembled, there are some cases where troubles, such as displacement of the chips and/or terminals, are caused.

The warpage of the ceramic circuit board when being cooled after heating must be in the range of from +0.05 mm to +0.6 mm. The reasons for this are as follows. If the warpage of the ceramic circuit board when being cooled after heating is less than +0.05 mm, a power module assembled by using such a ceramic circuit board can not have a sufficient reliability against heat cycles. On the other hand, if the warpage of the ceramic circuit board when being cooled after heating is greater than +0.6 mm, there are caused troubles so that the thickness of solder is uneven during the assembly of a power module to cause cracks in the solder and/or so that the dimension of each part of the module is not matched with each other due to the large warpage.

The initial warpage of a ceramic circuit board appears by the occurrence of residual stress due to a difference in coefficient of thermal expansion between a metal plate and a ceramic substrate and by mechanical stress applied during a production step. According to the present invention, the initial warpage is preferably in the range of +0.05 mm to +0.6 mm. If the initial warpage of the ceramic circuit board is less than +0.05 mm, tensile stress existing in the substrate is often too large to ensure reliability on the side of the pattern face as the whole substrate. Particularly, stress concentration is easier to occur to cause cracks at edges of the pattern face than the reverse surface. Therefore, the initial warpage is preferably +0.05 mm or more, and more preferably +0.1 mm or more. On the other hand, if the initial warpage is greater than +0.6 mm, various troubles, such as warpage, are caused at a step of producing a ceramic circuit board. For example, there are some cases where a mask for forming a pattern does not suitably adhere to a substrate due to its warpage, so that troubles, such as the influence on dimensional tolerance, are caused. Therefore, the initial warpage of the ceramic circuit board is preferably +0.6 mm or less. Thus, the initial warpage of the ceramic circuit board is preferably in the range of from +0.05 mm to +0.6 mm.

As an effective method for realizing the above described control of warpage, there is a method for sticking a metal circuit plate on a concave side of a ceramic substrate. Most of ceramic substrates generally used for power elements have sides, each of which has a length of 10 mm or more, and mass-produced general ceramic substrates have a thickness of 1.0 mm, 0.8 mm, 0.635 mm, 0.5 mm, 0.4 mm, 0.3 mm or 0.25 mm. The warpage of such a substrate is about 0 to 300 $\mu$m, and usually about 100 $\mu$m or less. The ceramic substrate for use in the present invention may be selected from the mass-produced general ceramic substrates. More specifically, the ceramic substrate is specially designed to be burned so as to have a desired warpage. Alternatively, the thickness of the metal circuit plate on the concave side (on the side of the pattern face) may be designed to be different from the thickness of the metal plate on the convex side. In this case, in the case of a copper plate, the thickness of the metal circuit plate on the concave side is preferably in the range of from 0.2 mm to 1.2 mm, and more preferably in the range of from 0.2 mm to 0.7 mm. The reasons why the thickness of the copper circuit plate on the concave side is in the range of from 0.2 mm to 1.2 mm are that the thickness of 0.2 mm or more is the minimum thickness electrically and thermally required when a large power element (e.g., IGBT) is used, and that, if the thickness is greater than 1.2 mm, residual stress caused in the ceramic substrate is increased by the factor of thickness, i.e. cracks are caused, to obstruct reliability. If the copper plate on the convex side is thinner than the copper circuit plate on the concave side, the above-described warpage is usually achieved. However, the thickness of the copper plate on the convex side may be determined in balance with the copper circuit plate on the concave side. In this case, the thickness of the copper plate on the convex side is in the range of from 0.1 mm to 1.1 mm. For the same reasons, the thickness of an aluminum circuit plate maybe in the range of from 0.3 mm to 2.4 mm, and the thickness of an aluminum plate may be in the range of from 0.1 mm to 2.2 mm. The main reasons why the thickness ranges are different from those in the case of copper are that the aluminum circuit plate and aluminum plate must be thicker since the electric conductivity and thermal conductivity of aluminum are lower than those of copper and that the deterioration of reliability is lower than that of copper even if the aluminum circuit plate and aluminum plate are thicker than the copper circuit plate and copper plate since stress caused in a ceramic by aluminum is lower than that by copper.

In order to further improve reliability, at least one through hole or recessed portion is preferably formed in at least one surface of the metal circuit plate and metal plate in the vicinity of the periphery thereof. A larger number of through holes or recessed portions are preferably formed unless there are no problems on other characteristics of the ceramic circuit board. Although there are some cases where the through holes or recessed portions hardly influence the warpage of the whole ceramic circuit board so as to hardly vary the warpage, the degree of relaxation of local stress concentration is large by the advantageous effects of the shape thereof, so that the larger number of through holes or recessed portions are preferably formed. If the through holes or recessed portions are formed on the convex portions of the metal circuit pattern and/or the corner and linear portions of the metal plate, the above described advantageous effects are increased. The through holes or recessed portions may be arranged double or triple along the periphery of the metal circuit pattern and/or the metal plate, and it is considered that it is more advantageous that the through holes or recessed portions are closer to the periphery of the metal circuit pattern and/or the metal plate. The size of the through holes or recessed portions should not particularly be limited. For example, unless the size obstructs the mounting of chips and soldering of a heat sink plate at a step of producing a power module, the diameter of the through holes or recessed portions is preferably in the range of about 0.1 mm to about 2.0 mm.

The ceramic substrate is preferably made of insulating alumina, aluminum nitride or silicon nitride as a principal component.

The three-point bending strength of the ceramic substrate is preferably 30 kgf/mm$^2$ or more. Because there are some cases where the absolute mechanical strength of the ceramic is insufficient to obstruct reliability if the three-point bending strength is less than 30 kgf/mm$^2$.

If the above described ceramic circuit board is used for producing a power module by steps of mounting thereon chips and terminals by soldering and wire-bonding, sealing them with an insulating resin and bonding them to a plastic package, the reliability of the ceramic circuit board contributes to the reliability of the module, so that it is possible to provide a reliable module.

Examples of ceramic circuit boards according to the present invention will be described below in detail.

EXAMPLE 1

Figure 2:
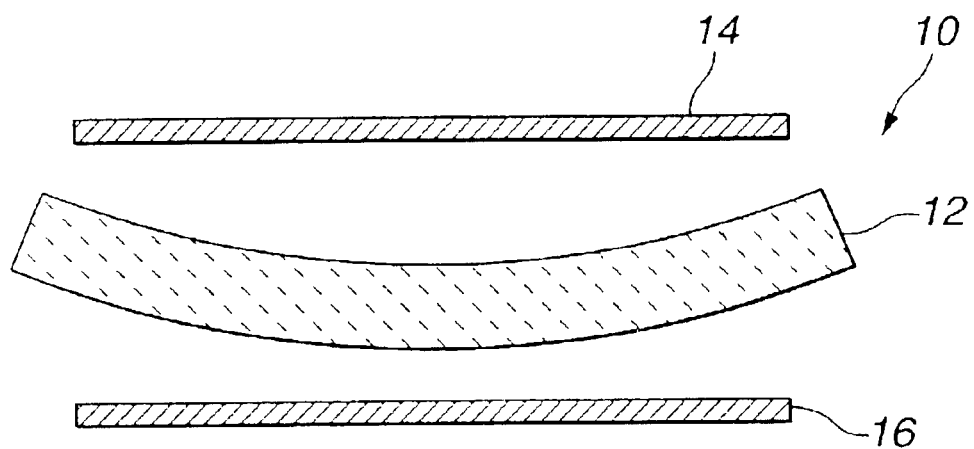
FIG. 2 is a sectional view for explaining a process for producing a ceramic circuit board according to the present invention.
Figure 3A:
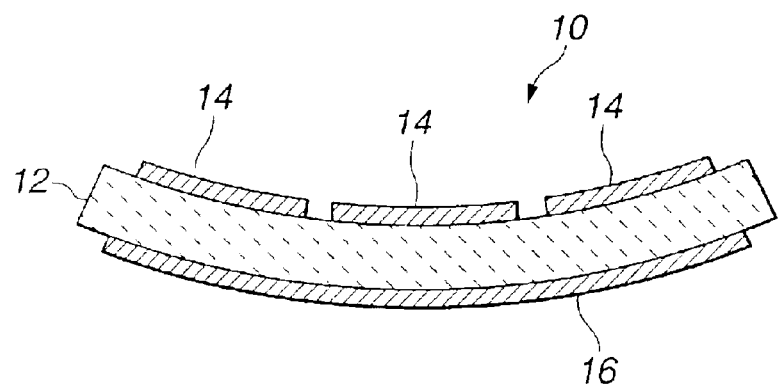
Figure 3B:
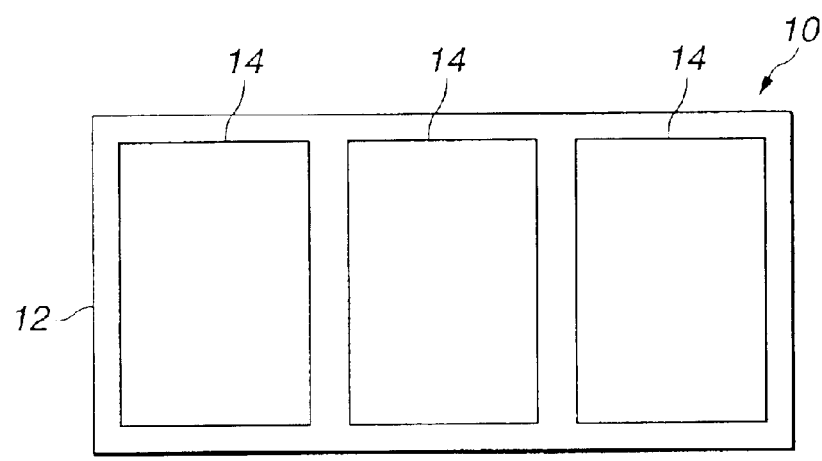
Figure 3C:
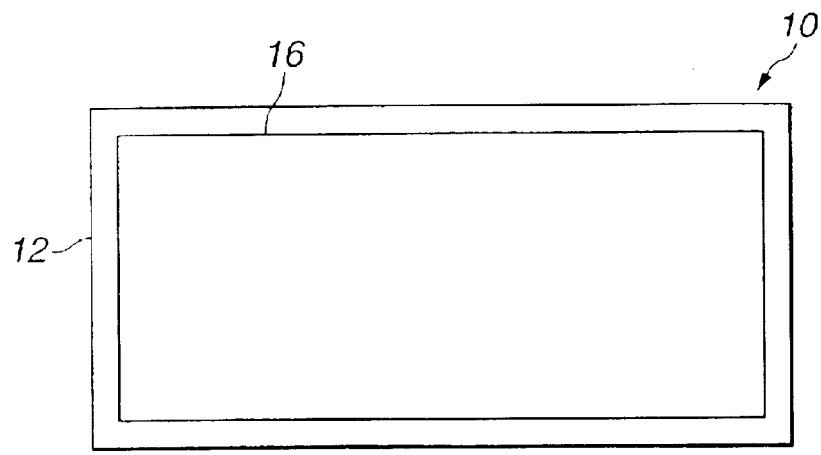

As shown in FIG. 2, an alumina substrate having a thickness of 0.25 mm was prepared as a ceramic substrate 12. Oxygen free copper plates (a copper plate 14 on the concave side having a thickness of 0.25 mm and a copper plate 16 on the convex side having a thickness of 0.2 mm), the surfaces of which were oxidized, were arranged on the concave side (on the side of a pattern face) and convex side of the alumina substrate to be heated in an atmosphere of an inert gas by means of a tunnel kiln to be bonded thereto. Thereafter, both sides were masked so as to form predetermined circuit patterns (the shape of the circuit pattern on the convex side was the shape of a heat sink plate) to be etched to obtain a ceramic circuit board 10 having a width of 37 mm and a length of 62 mm as shown in FIGS. 3A through 3C.

Figure 4A:
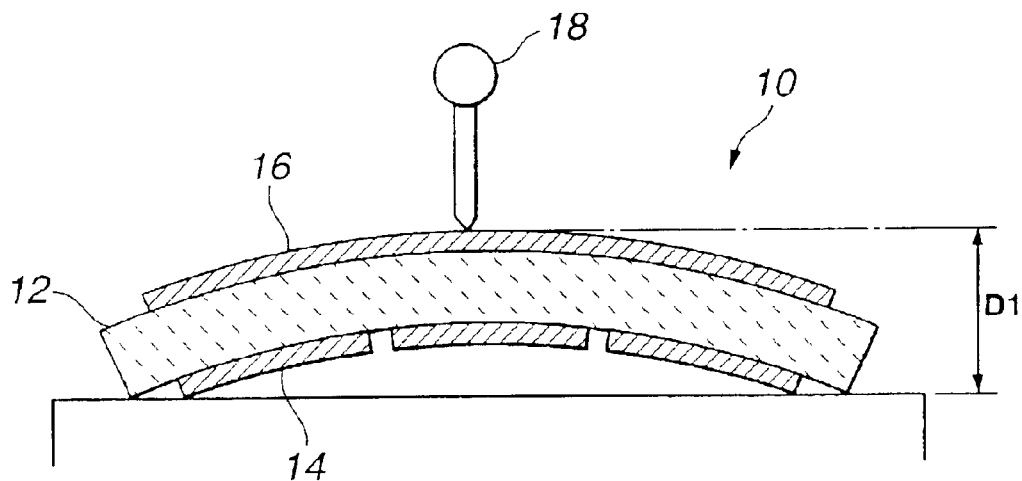
FIGS. 4A and 4B are sectional views for explaining a method for measuring a warpage of a ceramic circuit board.
Figure 4B:
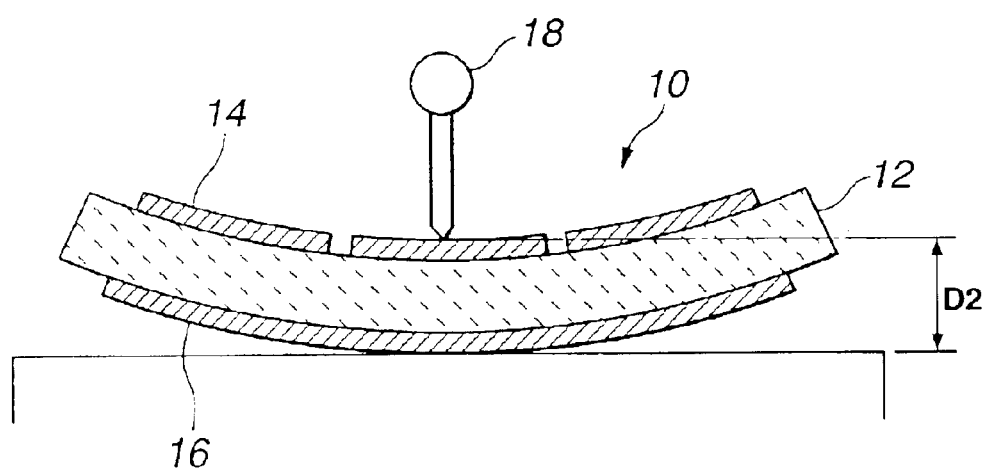

The initial warpage of the ceramic circuit board 10 thus obtained was measured by a dial gage. Specifically, as shown in FIG. 4A, the ceramic circuit board 10 was arranged on a surface plate so that the convex side thereof was upside, and the height D1 thereof was measured by a dial gage 18. Then, as shown in FIG. 4B, the ceramic circuit board 10 was arranged on the surface plate so that the concave side thereof was downside, and the height D2 thereof was measured by the dial gage 18. Then, the initial warpage was obtained from the difference (D1–D2) between the height D1 and the height D2. Similarly, the ceramic circuit board 10 was arranged on a hot plate, which was heated to 350±10° C., for one minute, and in this state, the warpage of the ceramic circuit board 10 was measured by the same manner. Thereafter, the ceramic circuit board 10 was unloaded from the hot plate. Then, the warpage of the ceramic circuit board 10 was measured when the ceramic circuit board was cooled to a room temperature while being left as it was.

The ceramic circuit board was passed through the tunnel kiln a plurality of times, and a furnace passing resistance was determined by the number of furnace passing treatments causing cracks in the ceramic substrate. Furnace passing conditions were based on general chip soldering conditions wherein each furnace passing treatment was carried out for 50 minutes and at the maximum temperature of 37° C. for 10 minutes. The presence of cracks was determined by observing the circuit board by the ink check (the liquid penetrant inspection method) by means of a stereoscopic microscope (×24).

EXAMPLE 2

A ceramic circuit board having a width of 26 mm and a length of 59 mm was produced by the same method as that in Example 1, except that an alumina substrate having a thickness of 0.25 mm was used as a ceramic substrate and that the ceramic circuit board was formed so as to have a different circuit pattern from that in Example 1. With respect to this ceramic circuit board, the warpage and furnace passing resistance were measured and determined by the same method as that in Example 1, respectively.

EXAMPLE 3

A ceramic circuit board having a width of 26 mm and a length of 50 mm was produced by the same method as that in Example 1, except that an alumina substrate having a thickness of 0.25 mm was used as a ceramic substrate and that the ceramic circuit board was formed so as to have a different circuit pattern from that in Example 1. With respect to this ceramic circuit board, the warpage and furnace passing resistance were measured and determined by the same method as that in Example 1, respectively.

EXAMPLE 4

A ceramic circuit board was produced by the same method as that in Example 1, except that through holes having a diameter of 0.5 mm were continuously formed in the vicinity of the periphery of the copper plate on the convex side. With respect to this ceramic circuit board, the warpage and furnace passing resistance were measured and determined by the same method as that in Example 1, respectively.

EXAMPLE 5

Figure 5A:
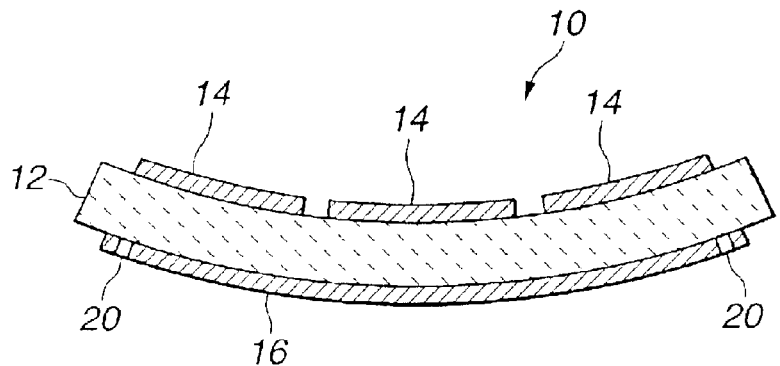
Figure 5B:
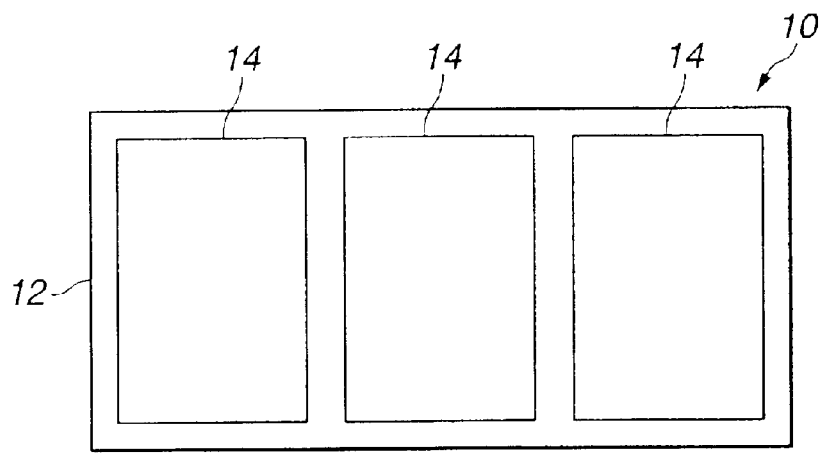
Figure 5C:
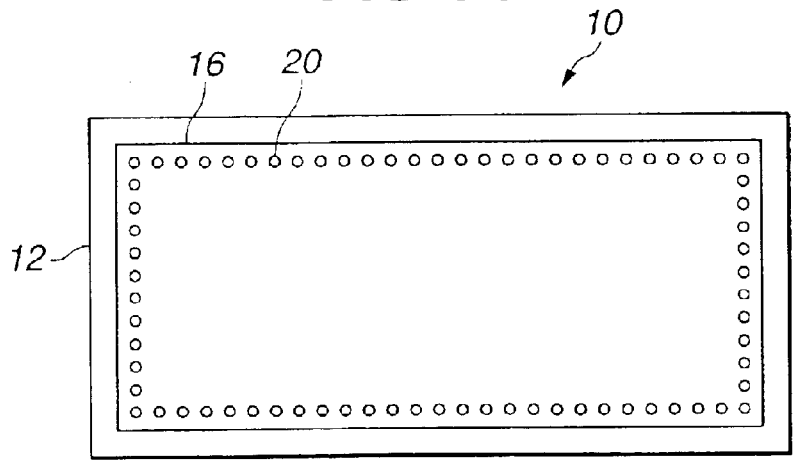

A ceramic circuit board 10 was produced by the same method as that in Example 1, except that through holes 20 having a diameter of 0.4 mm were continuously formed in the vicinity of the periphery of the copper plate on the convex side as shown in FIG. 5. With respect to this ceramic circuit board, the warpage and furnace passing resistance were measured and determined by the same method as that in Example 1, respectively.

EXAMPLE 6

Figure 6A:
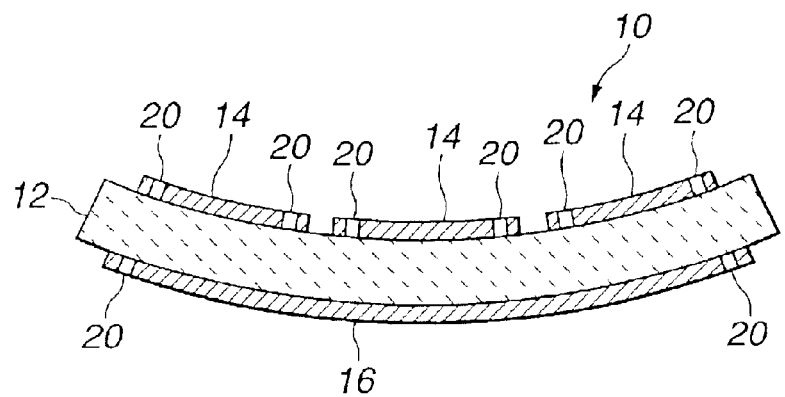
Figure 6B:
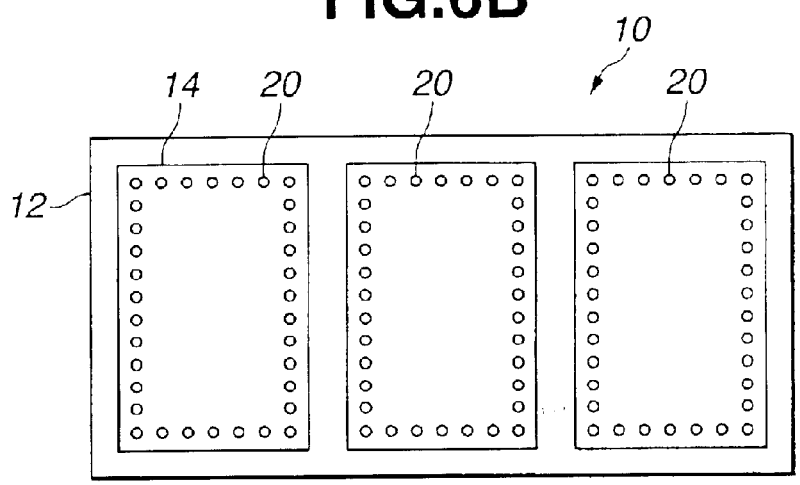
Figure 6C:
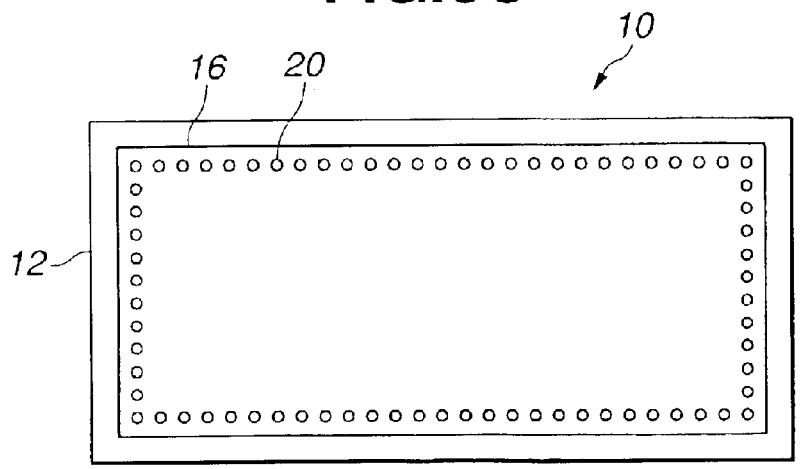

A ceramic circuit board 10 was produced by the same method as that in Example 1, except that through holes 20 having a diameter of 0.4 mm were continuously formed in the vicinity of the periphery of each of the copper plates on the convex and concave sides as shown in FIG. 6. With respect to this ceramic circuit board, the warpage and furnace passing resistance were measured and determined by the same method as that in Example 1, respectively.

EXAMPLE 7

Figure 7A:
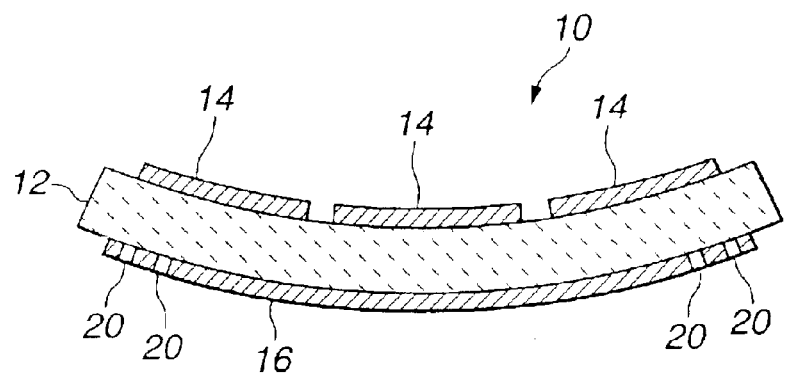
Figure 7B:
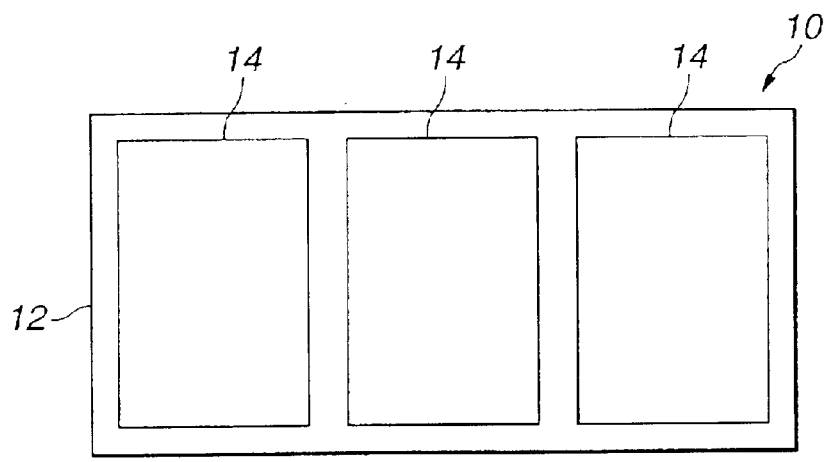
Figure 7C:
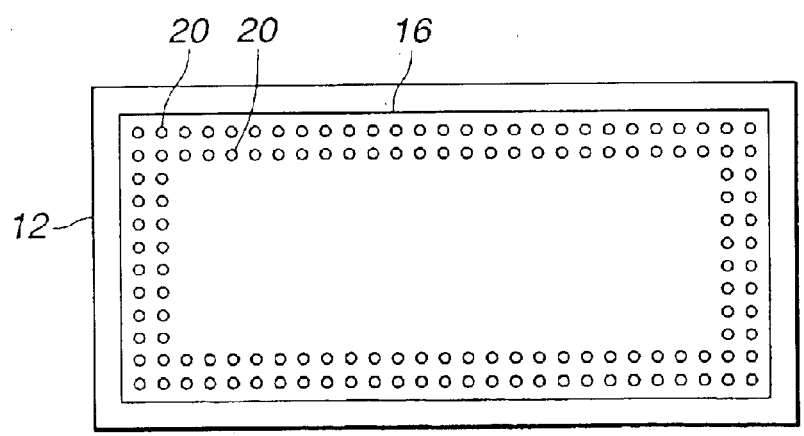

A ceramic circuit board 10 was produced by the same method as that in Example 1, except that through holes 20 having a diameter of 0.4 mm were continuously formed in two rows in the vicinity of the periphery of the copper plate on the convex side as shown in FIG. 7. With respect to this ceramic circuit board, the warpage and furnace passing resistance were measured and determined by the same method as that in Example 1, respectively.

EXAMPLE 8

A ceramic circuit board was produced by the same method as that in Example 1, except that through holes 20 having a diameter of 0.3 mm were continuously formed in two rows in the vicinity of the periphery of the copper plate on the convex side. With respect to this ceramic circuit board, the warpage and furnace passing resistance were measured and determined by the same method as that in Example 1, respectively.

EXAMPLE 9

An aluminum nitride substrate having a thickness of 0.635 mm was prepared as a ceramic substrate. Aluminum plates (an aluminum plate on the concave side having a thickness of 0.4 mm and an aluminum plate on the convex side having a thickness of 0.1 mm) were arranged on the concave side (on the side of a pattern face) and convex side of the substrate via a brazing filler metal of Al—Si to be heated by means of a vacuum furnace to be bonded thereto. Thereafter, both sides were masked so as to form predetermined circuit patterns (the shape of the circuit pattern on the convex side was the shape of a heat sink plate) to be etched to obtain a ceramic circuit board having a width of 37 mm and a length of 62 mm. At this time, similar to Example 6, through holes having a diameter of 0.4 mm were continuously formed in the vicinity of the periphery of each of the aluminum plates on the convex and concave sides. With respect to this ceramic circuit board, the warpage and furnace passing resistance were measured and determined by the same method as that in Example 1, respectively.

COMPARATIVE EXAMPLE 1

A ceramic circuit board was produced by the same method as that in Example 1, except that the copper plates were bonded to the ceramic substrate turned upside down so that the direction of the warpage of the ceramic substrate was inverted. With respect to this ceramic circuit board, the warpage and furnace passing resistance were measured and determined by the same method as that in Example 1, respectively.

COMPARATIVE EXAMPLE 2

A ceramic circuit board was produced by the same method as that in Example 3, except that the copper plates were bonded to the ceramic substrate turned upside down so that the direction of the warpage of the ceramic substrate was inverted. With respect to this ceramic circuit board, the warpage and furnace passing resistance were measured and determined by the same method as that in Example 1, respectively.

The results of Examples 1 through 9 and Comparative Examples 1 and 2 are shown in Table.

TABLE

| | WARPAGE (mm) | | | FURNACE PASSING RESISTANCE (TIMES) |
|---|---|---|---|---|
| | INITIAL | 350° C. | AFTER COOLING | |
| Ex. 1 | 0.173 | 0.023 | 0.384 | 7~8 |
| Ex. 2 | 0.225 | 0.048 | 0.358 | 7~8 |
| Ex. 3 | 0.078 | 0.030 | 0.176 | 6~7 |
| Ex. 4 | 0.170 | 0.019 | 0.394 | >10 |
| Ex. 5 | 0.174 | 0.020 | 0.395 | >10 |
| Ex. 6 | 0.180 | 0.033 | 0.402 | >10 |
| Ex. 7 | 0.167 | 0.015 | 0.400 | >10 |
| Ex. 8 | 0.169 | 0.018 | 0.405 | >10 |
| Ex. 9 | 0.105 | 0.005 | 0.150 | >10 |
| Comp. 1 | 0.025 | −0.175 | 0.002 | 3~5 |
| Comp. 2 | 0.010 | −0.106 | 0.037 | 3~5 |

Furthermore, the furnace passing resistance must be at least six times or more in view of the thermal shock resistance during assembly and the heat cycle resistance after assembly. As shown in Table, in Examples 1 through 9, the initial warpage was in the range of from 0.078 mm to 0.180 mm, the warpage when being heated to 350° C. was in the range of from 0.015 mm to 0.048 mm, the warpage after cooling was in the range of from 0.150 mm to 0.405 mm, and the furnace passing resistance was six times or more. On the other hand, in Comparative Examples 1 and 2, at least one of the initial warpage and the warpage when being heated to 350° C. was beyond the range of the present invention, and the furnace passing resistance was only three to five times.

As described above, according to the present invention, it is possible to provide an inexpensive, reliable ceramic circuit board which has an excellent thermal shock resistance.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A ceramic circuit board comprising:

a ceramic substrate; and a metal circuit plate bonded to one surface of said ceramic substrate, wherein assuming that a warpage of said ceramic circuit board is a difference in height between a center and edge of said metal circuit plate and is positive (+) when said circuit board warps so as to be concave on the side of said metal circuit plate, said ceramic circuit board has a warpage of −0.1 to +0.3 mm when said ceramic circuit board is heated to 350°C., and has a warpage of +0.05 to +0.6 mm when a temperature of said ceramic circuit board is returned to a room temperature after said ceramic circuit board is heated to 350° C.

2. A ceramic circuit board as set forth in claim 1, wherein said ceramic circuit board has an initial warpage of +0.05 to +0.6 mm.

3. A ceramic circuit board as set forth in claim 1, which further comprises a metal plate bonded to the other surface of said ceramic substrate.

4. A ceramic circuit board as set forth in claim 1, wherein at least one through hole or recessed portion is formed in a surface of said metal circuit plate in the vicinity of a periphery of said metal circuit plate.

5. A ceramic circuit board as set forth in claim 3, wherein at least one through hole or recessed portion is formed in a surface of at least one of said metal circuit plate and said metal plate in the vicinity of a periphery thereof.

6. A ceramic circuit board as set forth in claim 1, wherein said metal circuit plate is made of copper or aluminum as a principal component.

7. A ceramic circuit board as set forth in claim 3, wherein said metal plate is made of copper or aluminum as a principal component.

8. A ceramic circuit board as set forth in claim 3, wherein said metal circuit plate and said metal plate are made of copper as a principal component, said metal circuit plate having a thickness of 0.2 to 1.2 mm, and said metal plate having a thickness of 0.1 to 1.1 mm.

9. A ceramic circuit board as set forth in claim 3, wherein said metal circuit board and said metal plate are made of aluminum as a principal component, said metal circuit plate having a thickness of 0.3 to 2.4 mm, and said metal plate having a thickness of 0.1 to 2.2 mm.

10. A ceramic circuit board as set forth in claim 1, wherein a principal component of said ceramic substrate is selected from the group consisting of alumina, aluminum nitride and silicon nitride.

11. A ceramic circuit board as set forth in claim 1, wherein said ceramic substrate has a three-point bending strength of 30 kgf/mm$^2$ or more.

12. A method for producing a ceramic circuit board, said method comprising the steps of:

preparing a ceramic substrate and a metal circuit plate; and bonding said metal circuit plate to a concave side of said ceramic substrate to produce a ceramic circuit board wherein assuming that a warpage of said ceramic circuit board is a difference in height between a center and edge of said metal circuit plate and is positive (+) when said circuit board warps to be concave on the side of said metal circuit plate, said ceramic circuit board has a warpage of −0.1 to +0.3 mm when said ceramic circuit board is heated to 350° C., and has a warpage of +0.05 to +0.6 mm when a temperature of said ceramic circuit board is returned to a room temperature after said ceramic circuit board is heated to 350° C.

13. A method for producing a ceramic circuit board as set forth in claim 12, wherein said metal circuit plate is bonded directly to said ceramic substrate or bonded to said ceramic substrate via a brazing filler metal.

14. A method for producing a ceramic circuit board as set forth in claim 12, which further comprises a step of bonding a metal plate to a convex side of said ceramic substrate.

15. A method for producing a ceramic circuit board as set forth in claim 14, wherein said metal circuit plate and said metal plate are bonded directly to said ceramic substrate or bonded to said ceramic substrate via a brazing filler metal.

16. A power module assembled by using a ceramic circuit board as set forth in any one of claims 1 through 11.

* * * * *